United States Patent [19]

Jinich

[11] Patent Number: 4,748,423
[45] Date of Patent: May 31, 1988

[54] HOT STANDBY AMPLIFIER APPARATUS
[75] Inventor: Leon Jinich, Plano, Tex.
[73] Assignee: Rockwell International Corporation, El Segundo, Calif.
[21] Appl. No.: 7,853
[22] Filed: Jan. 28, 1987
[51] Int. Cl.$^4$ ............................................. H03F 3/68
[52] U.S. Cl. .............................. 330/295; 330/124 D; 330/277
[58] Field of Search ............ 330/9, 51, 124 D, 124 R, 330/277, 295, 296

[56] References Cited
U.S. PATENT DOCUMENTS
3,345,578 7/1987 Shuda ............................ 330/124 D Primary Examiner—Eugene R. LaRoche
Assistant Examiner—Steven J. Mottola
Attorney, Agent, or Firm—Bruce C. Lutz; V. L. Sewell; H. Fredrick Hamann

[57] ABSTRACT

The realization that field effect transistor current can be controlled by adjusting the gate voltage and thereby controlling the amplifier power consumption with only a slight degradation of RF gain and signal quality is utilized in a hot standby radio system configuration. The standby amplifier is left in an ON condition with the gate voltage adjusted to a low value until such time as the amplifier is needed for active service. At this time the gate voltage is adjusted to the optimal value and the amplifier is operated in a normal condition. The standby mode still allows tests to ascertain whether or not the amplifier is operational while conserving substantial amounts of power.

5 Claims, 4 Drawing Sheets

HOT STANDBY AMPLIFIER APPARATUS

THE INVENTION

The present invention is generally related to electronics, and more specifically, to amplifier circuits, and even more specifically, to the reduction in power consumption of circuitry including active and standby amplifiers.

BACKGROUND

There are many instances in the communication industry environment where it is desirable to have an alternate communication channel. If this alternate communication channel is to be effectively ued without loss of significant amounts of data, this alternate channel must be maintained in a ON or "hot" standby condition. Thus, the spare communication channel is utilizing or consuming power even though it is not in active service. As will be realized by those skilled in the art, the standby amplifier or standby communication channel exists not only at the transmission end and at the receiving end, but typically at the intermediate relay stations or transceivers between the transmitter and the ultimate end user.

The present invention utilizes a realization that a lower than "normal" or "optimum" bias voltage applied to a given amplifier stage reduces the power consumption with only a minor degradation in quality of linearity of the output signal as compared to the input signal. In other words, the signal is only slightly more distorted at a low bias voltage level, while the power consumption is substantially reduced. If the standby amplifier has one or more output stages with a reduced bias voltage applied during the standby condition, the amplifier can be switched into service in less time than it takes to bring up an amplifier from a "cold" condition. Although the changing from a low bias somewhat distorted signal to a normal bias level is extremely quick and often is less than any switching requirements existent, the amplifier could operate in the somewhat distorted signal condition momentarily and still provide satisfactory service. In any event, power consumption requirements are substantially reduced for the total apparatus, and the amplifier which was previously in active use and has been switched to standby, would typically be changed to the lower bias condition so that it would save on power consumption.

It is thus an object of the present invention to provide improved power consumption efficiencies in standby amplifier circuits.

Other objects and advantages of the present invention will be ascertained from a reading of the specification and appended claims in conjunction with the drawings wherein:

DETAILED DESCRIPTION

Figure 1:
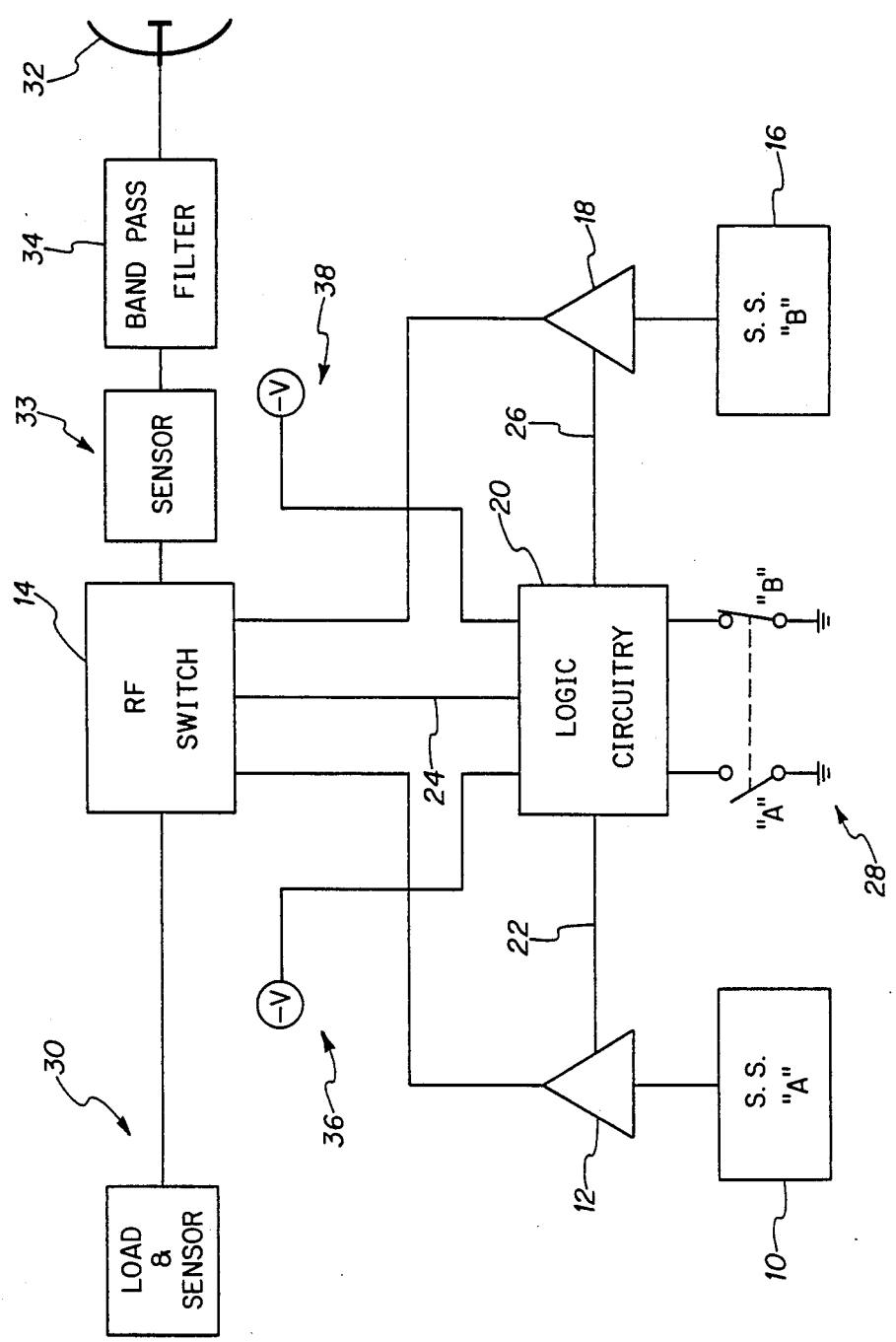
FIG. 1 is a block diagram of a transmitting section of a communication system having a standby and active amplifier stage.

In FIG. 1, a source of signals for channel A is illustrated as a block 10 and labeled S.S.A. The signals are transmitted to a power amplifier 12 for application to a signal switching device such as RF switch 14. A second signal channel is illustrated with a source of signals block 16 labeled S.S. B and a similar amplifier 18, also supplying signals to the RF switch 14. Logic circuitry containing a block 20 provides control signals to blocks 12, 14 and 18 via leads 22, 24 and 26, respectively. The switches, generally designated as 28, would be exclusive so that either the A or B switch would make contact, so as to indicate which of the two amplifiers would be in an "active" condition. The RF switch also is connected via a lead to a dummy load 30 including an RF monitor point and a signal sensor detector for connection to alarm circuitry. The RF switch 14 is also connected to an output load, such as an antenna 32 via a RF monitor and alarm circuit signal sensor detector 33 and a bandpass filter 34. The logic circuitry 20 is also connected to a pair of bias signal sources 36 and 38.

Figure 2:
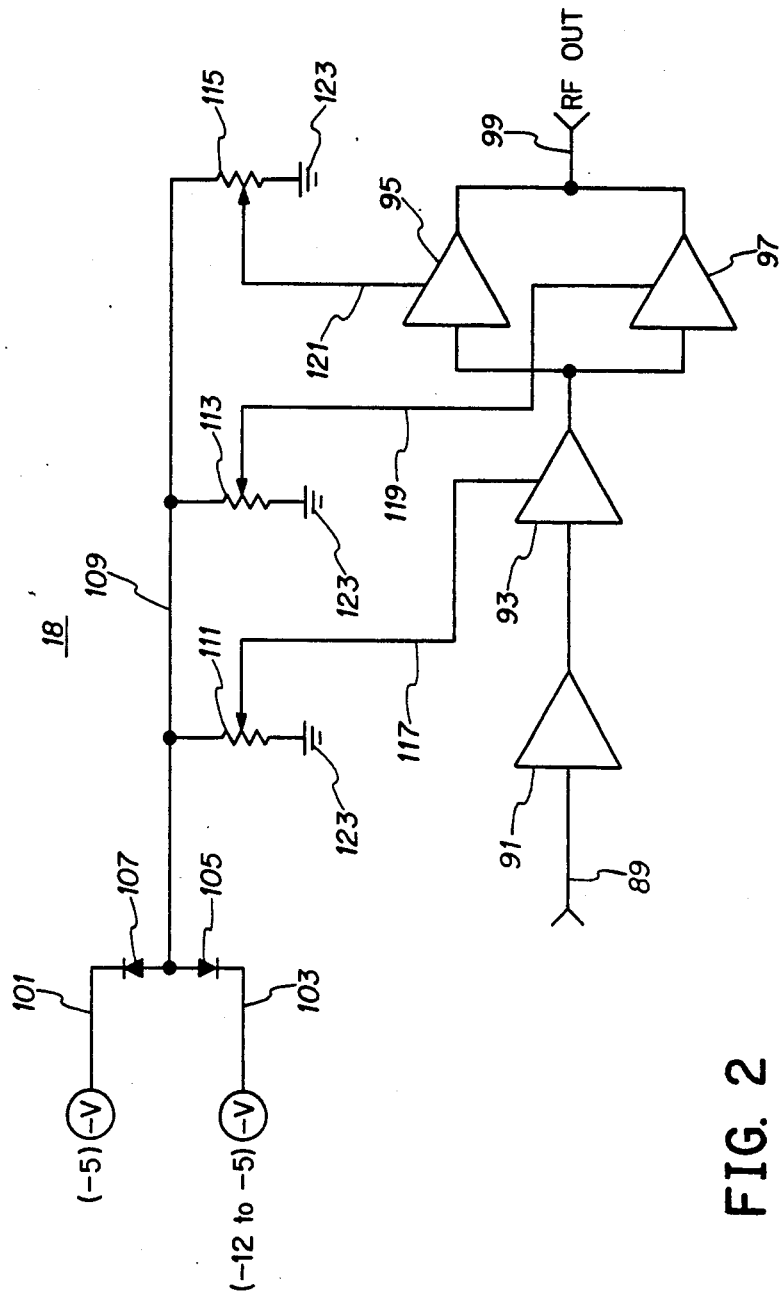
FIG. 2 is a block diagram of a power amplifier for use in the each of the amplifier portions of FIG. 1.

In FIG. 2, a power amplifier, such as shown in block 18 of FIG. 1, is illustrated having an input lead 89 supplying signals to a pre-amplifier stage 91 which provides output signals to a further or power amplifier stage 93. An output of power stage 93 provides its output to a pair of amplifier stages 95 and 97. These stages provide a balanced output. The outputs of amplifiers 95 and 97 are recombined and provided as an output on a lead 99. Bias for these amplifier stages 93 through 97 is provided from a power source comprising a −5 volt power supply source 101 and a variable power supply source 103 which while variable from −12 to −5 volts in one embodiment of the invention would typically be at −9 volts. A pair of diodes 105 and 107 are shown connected between the power supplies 103 and 101, respectively, and connected to a common lead 109. A set of potentiometers 111, 113 and 115 are adjusted to appropriate values and the output wipers are connected respectively via leads 117, 119 and 121 to the amplifiers 93, 97 and 95. The other end of each of the potentiometer windings are connected to ground 123.

Figure 3:
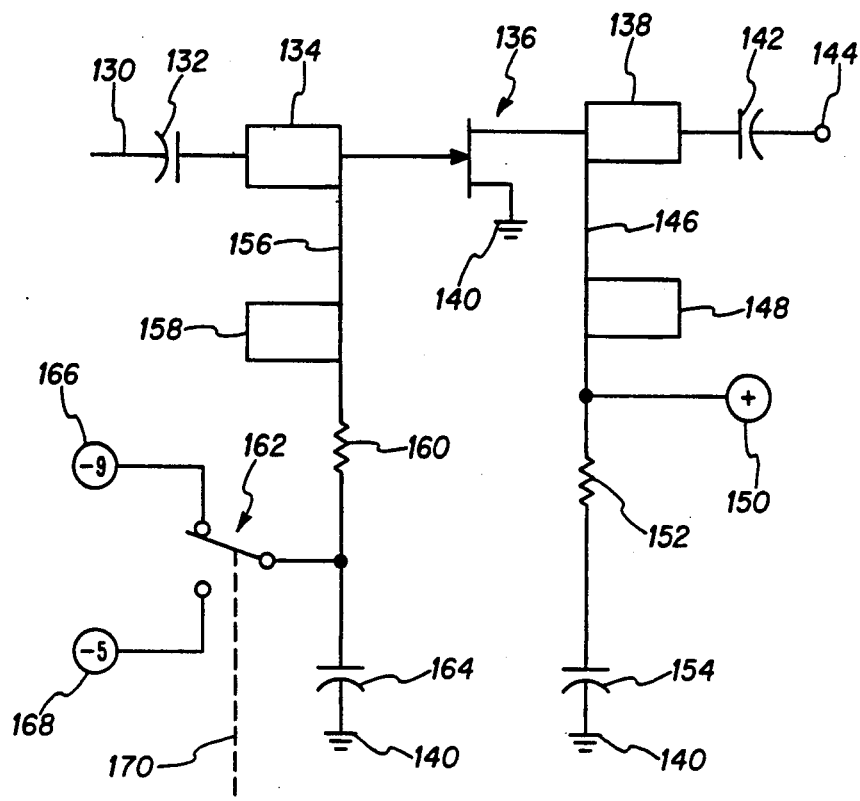
FIG. 3 is a schematic diagram representative of a typical amplifier stage found within FIG. 2.

In FIG. 3, a stage which in one embodiment of the invention represents that contained within amplifier stage 93 of FIG. 2 is shown having an input signal provided to a lead 130. Signals are supplied through a capacitive element 132 to a block 134 representing a microstrip line. An output of block 134 is supplied to an FET generally designated as 136, having a drain connected to a further microstrip element 138 and a source connected to ground 140. Microstrip element 138 is connected through a capacitive element 142 to an output 144. The microstrip element 138 is operatively connected via a lead 146 to a quarter wavelength filtering element 148 and from there to a positive power source 150. Positive power souce 150 is also connected through a resistive element 152 and a capacitive element 154 to ground 140. The previously mentioned microstrip line 134 is operatively connected via a lead 156 to a quarter wavelength filtering means 158 and thence through a resistive element 160 to position switching element 162. The resistive element 160 is also connected through a capacitive element 164 to ground 140. As shown, the switchable element of switch 162 is connected to a −9 volt power supply terminal 166 and can be altered to connect to a −5 volt power supply element 168. The switching action is denoted schematically by a dash line 170. An actual implementation of switch 162 would be solid state. However, the switch is shown as a mechanical element for ease of illustration.

Figure 4:
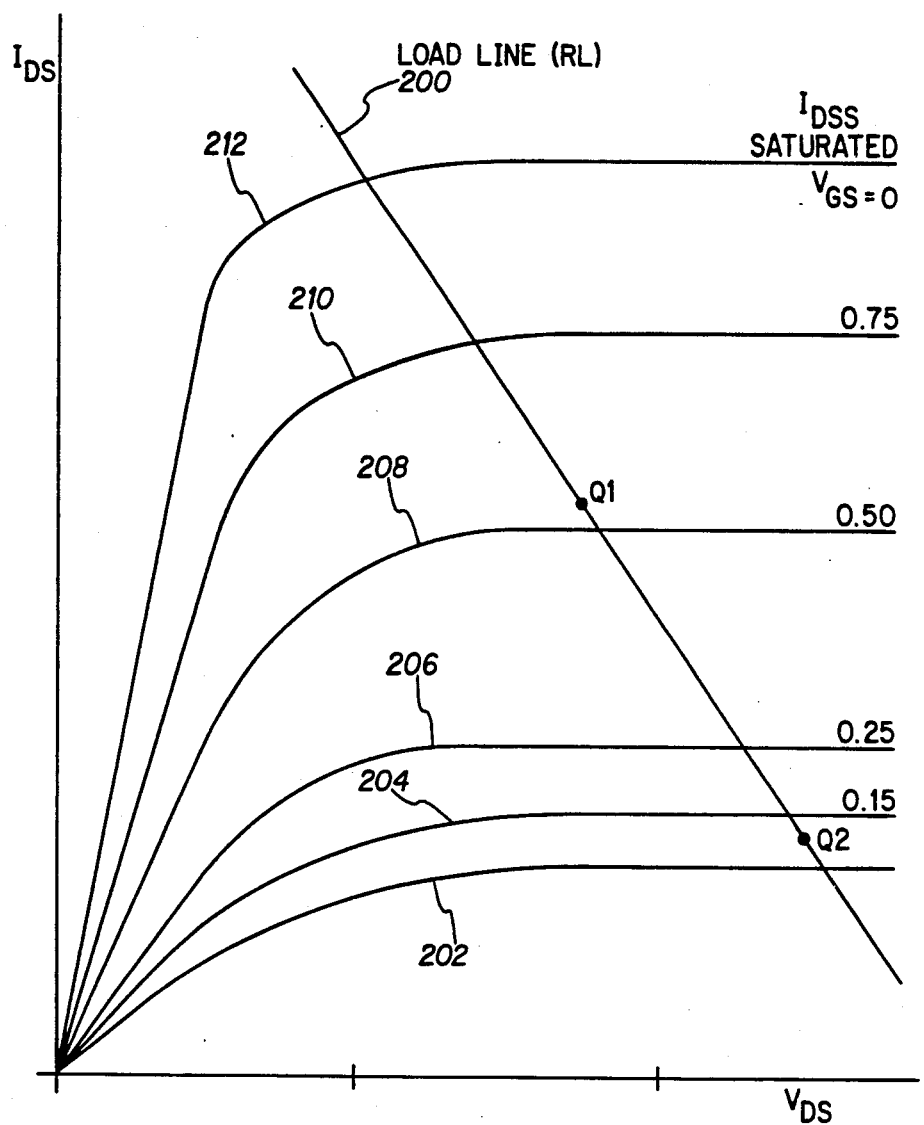
FIG. 4 is a I-V curve of an active element in an amplifier stage, such as an FET.

FIG. 4 comprises a series of curves showing the current from drain to source versus the relative voltage from drain to source for each of a plurality of currents from the gate to the source lead. The drain source current is shown on the vertical axis while the drain source voltage is shown on the horizontal axis. A load line is represented by 200 and a plurality of bias currents are shown as 202, 204, 206, 208, 210 and 212. On the load line 200, are shown two representative bias points Q1 and Q2, with Q1 providing a reasonably linear change of drain-source current with a change in current through the gate or bias voltage applied to the gate. Bias point Q2 illustrates a point in the curve wherein the incremental change of load current would be non-linear. The curves in both FIGS. 4 and 5 have been exaggerated for the purposes of illustration and the actual distortion usable in this invention would be much less than that illustrated.

FIG. 5a illustrates an input signal to be amplified, FIG. 5b illustrates an output signal obtained from the circuit of FIG. 3 under the Q1 bias conditions, whereas FIG. 5c illustrates the output signal obtained from FIG. 3 under the bias conditions represented by Q2.

OPERATION

The set of curves in FIG. 4 is representative of the current from source to drain in an FET for a range of voltages from source to drain for each of a plurality of gate to source currents. This is the type of curve used by design engineers to design amplifier stages. In referring to FIG. 3, it will be noted that there is a positive power supply 150, which would set the maximum voltage along the horizontal axis of FIG. 4. The maximum current would be ascertained by dividing the voltage of the source 150 by the series resistances between 150 and ground 140. These two points would establish the load line 200 of curve 4.

In the typical design of an amplifier stage in the prior art, a quiescent setting is utilized, so that signal variations to the gate provide equal amplitude excursions of current through the load resistors for equal increments of positive and negative signal on either side of the quiescent or no-signal condition. Thus, the typical prior art approach would be to use a quiescent current such as that designated by Q1 in FIG. 4. As will be observed, the gate current curves are spaced for substantially equal incremental differences in gate current. It will be observed, however, that the current from source to drain is relatively high. If a quiescent current such as Q2 were used, the current from the source 150 would be considerably less. However, due to the unequal incremental changes around the point Q2, there would be some distortion in the output signal, since input signal variations of a given amount above and below the value Q2 would not provide equal incremental changes in the load current.

Figure 5:
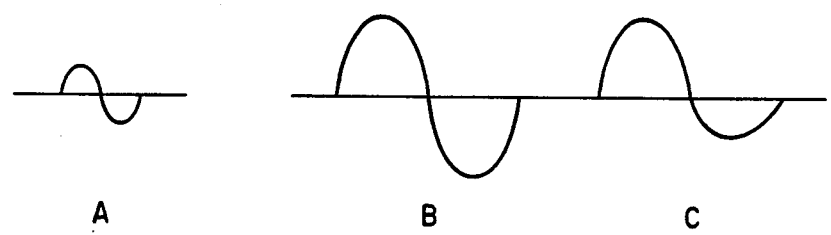
FIGS. 5a, 5b and 5c, comprise a set of waveforms for use in explaining the operation of the amplifier stages illustrated in FIGS. 2 and 3.

As previously mentioned, the input signal is represented in FIG. 5 by waveform 5a whereas the output signal at terminal 144 of FIG. 3 is represented by FIG. 5b for quiescent point Q1, and by 5c for quiescent point Q2. As also previously mentioned, the waveform 5c is considerably distorted for ease of illustration, and typically the quiescent points would be chosen so that there would not be as much distortion as illustrated, and yet would provide considerable power consumption savings.

The circuit of FIG. 3 is substantially the circuit used in amplifier stage 93 of FIG. 2 in one embodiment of the inventive concept. Similar circuits were used in stages 95 and 97. Thus, three stages of the amplifier enjoyed considerable power savings when operated in the Q2 mode or, in other words, when switch 162 was such that power supply 168 was connected to bias the FET 136 of FIG. 3. When switch 162 is operated to the opposite condition, so that bias is supplied by source 166, the Q1 quiescent current condition is activated and the output power is increased as is the linearity, since the distortion is substantially eliminated in this biasing condition. In one embodiment of the invention, the power consumption was reduced 40% by changing the bias of the three stages illustrated in FIG. 2. A further side effect of reducing the bias level in addition to some additional distortion, is that the power output of the amplifier will drop. In the embodiment, as mentioned before, where the power consumption was reduced by 40%, the power output by the amplifier, was reduced by 20%.

FIG. 2 illustrates one embodiment of an amplifier which uses the adjustable potentiometers 111, 113 and 115 to adjust the bias voltages to the various stages of the amplifiers 93, 95 and 97. When the voltage on the lead 103 is altered from a normal value to a less than normal value, the bias on each of the appropriate stages is reduced and the signal at the output 99 is accordingly somewhat more distorted, but the power drawn for each of these amplifier stages is substantially reduced. The power source for the amplifier stages is not illustrated.

In the main hot standby configuration of FIG. 1, it may be assumed that amplifier 12 is in active use, and the signals from source 10 are being amplified by amplifier 12 and passed through RF switch 14, the bandpass filter 34 to a load such as antenna 32. This amplifier 12 is operating at "normal" bias levels and, accordingly, produces a substantially non-distorted output signal. The amplifier 18 on the other hand may or may not receive input signals from up-converter signal source 16. Whether or not it receives signals depends on the configuration of the communication channel. In the embodiment shown, the RF output power from both (main and hot-standby) amplifiers are monitored all the time. The signals that the RF switch receives from the standby amplifier are supplied to a dummy load 30 through the RF switch 14. The logic circuitry 20 operates to switch the normal and less than normal bias signal levels from sources 36 and 38 to the appropriate one of amplifiers 12 and 18, being operated in the standby mode. Although the signal supplied to dummy load 30 may be distorted, this is of no concern to the load itself. When the logic circuitry is provided a signal from switch 28 that amplifier 18 is to be placed in an active or main condition, and amplifier 12 is to be placed in a standby condition, the loads 30 and 32 are switched as to the source of their signals, the bias supplies 36 and 38 are also switched and amplifier 18 then proceeds to supply power output signals to antenna 32.

When a component in the standby amplifier fails, the lack of signal will be detected by the circuitry 30 and an alarm will be turned ON. If on the other hand, there is a failure in the main amplifier circuitry, the logic block 20 will issuse a switching command to switch 14 to bring the standby amplifier circuit into operation.

As will be realized, the quality of the hot-standby signal terminated into a dummy load is not relevant, its presence however is what is being detected by the signal sensor comprising a part of load 30.

In summary, the present invention utilizes the realization that a considerable power consumption efficiency can be realized by operating one or more stages of a power amplifier in a low bias condition when that amplifier is in a standby mode. Since the amplifier is in an ON condition, it can be placed into an operating condition very quickly by merely changing the bias level and thus changing the output signal from a somewhat distorted signal to a very low distortion signal and under appropriate circumstances, all synchronization of the signals will already have been performed with the slightly distorted signal. A further advantage to the lower power used in the standby mode is that the temperature produced within the amplifier enclosure is lower due to the lower heat dissipation and this, accordingly, increases the component life and the reliability of the amplifier during its standby mode operation under the lower power consumption condition. In remote areas, the lower power consumption may be particularly important due to increased battery life, etc.

Although a single embodiment of the inventive concept has been disclosed, I wish to include all alterations to the specific embodiment included by the invention as claimed in the appended claims, wherein I claim:

1. The method of conserving power in the operation of a standby amplifier circuit of main and standby amplifier apparatus comprising, the steps of:
   changing the bias level, of at least one power output stage, of whichever one of main and standby amplifiers that is presently in a standby use condition, to a value that is lower than the value of a comparable stage in the amplifier which is presently in a main use condition while leaving the standby use amplifier in an "ON" but distorted output signal condition; and
   altering the bias levels, of said at least one power output stage, of each of the main and standby amplifiers when a switch is required from an old main amplifier to new main amplifier (old standby) which was previously in a standby use condition, to a value that is lower than the value of a comparable stage in the amplifier which is presently in a main use condition.

2. Control apparatus comprising, in combination:
   amplifier first means including a power output stage for providing output signals and having a stage bias control second means, a level of a bias signal being applied to said second means acting to control the power used by said first means;
   amplifier third means including a power output stage for providing output signals and having a stage bias control fourth means, a level of a bias signal being applied to said fourth means acting to control the power used by said second means;
   load fifth means for receiving signals from one of said amplifier first and third means;
   bias signal source sixth means, including at least normal and low voltage level bias means; and
   logic control seventh means connected to said first through sixth means for switching said fifth means to receive output signals from either said first or third means while simultaneously switching the bias levels supplied from said sixth means to said second and fourth means whereby the amplifier means not connected to said fifth means receives lower voltage level bias signals for conserving power than are received by the amplifier means which is connected to said fifth means.

3. Control apparatus comprising, in combination:
   amplifier first means including a power output stage, for providing power output signals, having a stage bias control second means, the power used by said power output stage of said first means decreasing as a function of stage bias signal levels with a signal distortion in said power output signals increasing as a bias level is lowered from a "normal" bias signal level;
   amplifier third means including a power output stage, for providing power output signals, having a stage bias control fourth means, the power used by said power output stage of said second means decreasing as a function of stage bias signal levels with a signal distortion in said power output signals increasing as a bias level is lowered from a "normal" bias signal level;
   load fifth means for receiving power output signals from one of said amplifier first and third means;
   bias signal source sixth means, including at least normal and lower than normal voltage level bias signal means; and
   logic control seventh means connected to said first through sixth means for switching said fifth means to receive power output signals from either said first or third means to place that amplifier in the active mode while simultaneously switching the bias levels supplied from said sixth means to said second and fourth means whereby the amplifier means not placed in the active mode is placed in a standby mode and receives lower than normal voltage level bias signals for conserving power.

4. Active and operationally "ON" standby amplifier apparatus comprising, in combination:
   first and second amplifier means, each including bias level control means, one of said first and second amplifier means operating in a reduced power consumption standby mode while still being in a signal amplifying "ON" condition and the other of said first and second amplifier means operates in an active mode;
   bias signal supply means; and
   control logic means connected to said bias signal supply means and to each of said first and second amplifier means for supplying lower level bias signals to the bias level control means of the amplifier operating in the standby mode than to the bias level control means of the amplifier operating in the active mode.

5. The method of conserving power in the operation of a standby amplifier circuit of main and standby amplifier apparatus while maintaining the switching speed capabilities of the standby amplifier remaining in an "ON" condition comprising, the steps of:
   lowering the bias level, of at least one power output stage, of whichever one, of first and second amplifiers, that is presently in a standby use condition, to a value that is less than that required for substantially distortion free operation and which is less than the bias value level of the one of said first and second amplifiers that is in a main use condition; and
   altering the bias levels, of said at least one power output stage, of each of the main and standby amplifiers when a switch is required from an old main amplifier to new main amplifier (old standby) which was previously in a standby use condition, to a value that is lower than the value of a comparable stage in the amplifier which is presently in a main use condition.

* * * * *